(12) United States Patent
Boemler

(10) Patent No.: US 7,214,919 B2
(45) Date of Patent: May 8, 2007

(54) MICROELECTRONIC IMAGING UNITS AND METHODS OF MANUFACTURING MICROELECTRONIC IMAGING UNITS

(75) Inventor: Christian Boemler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 110 days.

(21) Appl. No.: 11/054,692

(22) Filed: Feb. 8, 2005

(65) Prior Publication Data

US 2006/0175532 A1      Aug. 10, 2006

(51) Int. Cl.
- H01L 27/00    (2006.01)
- H01L 31/00    (2006.01)
- H01J 40/14    (2006.01)
- H01J 5/02     (2006.01)

(52) U.S. Cl. .............................. 250/208.1; 250/214.1; 250/239; 257/433

(58) Field of Classification Search ............. 250/208.1, 250/214.1, 239; 257/433–434; 438/57, 438/68, 64–66, 59–60, 116, 124

See application file for complete search history.

(56) References Cited

U.S. PATENT DOCUMENTS 4,634,884 A    1/1987    Hayashimoto et al.

6,828,545 B1 *  12/2004   Hamilton et al. ........ 250/214.1
2003/0057359 A1   3/2003   Webster
2006/0038183 A1 *  2/2006   Oliver ........................ 257/79

FOREIGN PATENT DOCUMENTS

EP    0 253 375 A2   1/1988
JP    2003-032537    1/2003
WO    WO 03/061276 A1  7/2003

OTHER PUBLICATIONS

International Search Report dated Jun. 28, 2006.

* cited by examiner

Primary Examiner—Stephone B. Allen
Assistant Examiner—Patrick J. Lee
(74) Attorney, Agent, or Firm—Dickstein Shapiro LLP

(57) ABSTRACT

Microelectronic imaging units and methods for manufacturing the microelectronic imaging units. In one embodiment, an imaging unit includes a support member, an imaging die attached to the support member, and a driving member attached to the imaging die and the support member. The imaging die includes an image sensor, an integrated circuit operably coupled to the image sensor, and a plurality of external contacts operably coupled to the integrated circuit. The driving member is configured to selectively move the imaging die relative to the support member. For example, the image sensor can define a focal plane, and the driving member can move the imaging die along an axis in the focal plane.

76 Claims, 7 Drawing Sheets

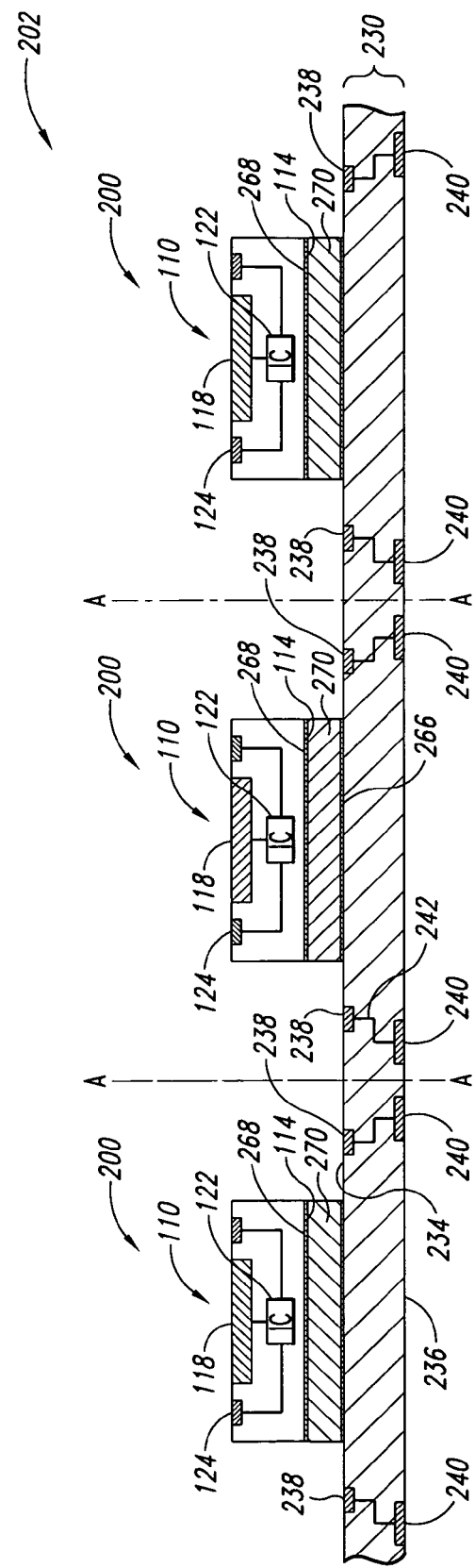
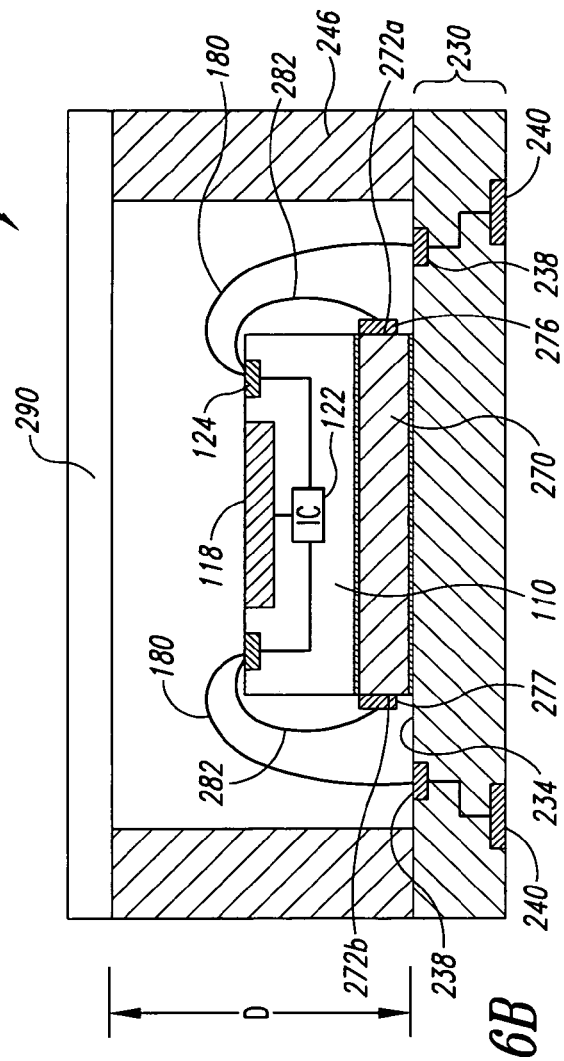
Fig. 6A
Fig. 6B

MICROELECTRONIC IMAGING UNITS AND METHODS OF MANUFACTURING MICROELECTRONIC IMAGING UNITS

TECHNICAL FIELD

The present invention is related to microelectronic imaging units having solid-state image sensors and methods for manufacturing such imaging units.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming -very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

FIG. 1 is a schematic side cross-sectional view of a conventional microelectronic imaging assembly 1 including an imaging unit 5 and a plurality of actuators 40 (shown schematically) coupled to the imaging unit 5. The imaging unit 5 includes an imaging die 10, a chip carrier 30 carrying the die 10, and a cover 50 attached to the carrier 30 and positioned over the die 10. The imaging die 10 includes an image sensor 12 and a plurality of bond-pads 16 operably coupled to the image sensor 12. The chip carrier 30 has a base 32, sidewalls 34 projecting from the base 32, and a recess 36 defined by the base 32 and sidewalls 34. The die 10 is accordingly sized to be received within the recess 36 and attached to the base 32. The chip carrier 30 further includes an array of terminals 18 on an interior surface of the base 32, an array of contacts 24 on an external surface of the base 32, and a plurality of traces 22 electrically connecting the terminals 18 to corresponding external contacts 24. The terminals 18 are positioned between the die 10 and the sidewalls 34 so that wire-bonds 20 can electrically couple the terminals 18 to corresponding bond-pads 16 on the die 10.

The image sensor 12 includes a plurality of pixels that each measure the intensity of either red, green, or blue light. Because each pixel senses only a single color, the other two colors at each pixel are interpolated from the measurements of adjacent pixels. This may produce inaccuracies in the color of the captured image. The inaccuracies are especially problematic near sharp transitions in the image and when a single color from the imaged object projects onto multiple pixels. To reduce interpolation, some electronic devices include motors or other actuators 40 for moving the imaging unit 5 to increase the resolution of the captured images. The actuators 40 shift the imaging unit 5 so that each pixel is exposed to light at several locations. For example, the actuators 40 may shift the entire imaging unit 5 such that a measurement from each of a red, green, and blue pixel is obtained for each pixel location of the image sensor 12. The measurements of the different pixels at a single pixel location are input into an algorithm to calculate the color at the location.

One problem with conventional imaging assemblies is that the combination of the imaging unit and actuators has a relatively large footprint and occupies a significant amount of vertical space (i.e., high profile). For example, the footprint of the imaging assembly 1 in FIG. 1 is the surface area of the actuators 40 and the base 32 of the chip carrier 30, which is significantly larger than the surface area of the imaging unit 5. Accordingly, the footprint and vertical profile of conventional imaging assemblies can be limiting factors in the design and marketability of digital cameras, picture cell phones, or PDAs because these devices are continually being made smaller in order to be more portable. Therefore, there is a need to provide imaging assemblies with smaller footprints and lower vertical profiles.

BRIEF DESCRIPTION OF THE DRAWINGS

FIGS. 2A–3B illustrate stages in one embodiment of a method for manufacturing a microelectronic imaging unit in accordance with the invention.

FIG. 2A is a schematic side cross-sectional view of a microelectronic imaging unit having an imaging die, a support member, and a flexible member attached between the imaging die and the support member.

FIG. 3B is a top plan view of the imaging unit illustrated in FIG. 3A.

FIGS. 6A and 6B illustrate stages of a method for manufacturing a plurality of imaging units in accordance with another embodiment of the invention.

FIG. 6A is a schematic side cross-sectional view of a microfeature workpiece having a support member, a plurality of driving members attached to the support member, and a plurality of imaging dies attached to corresponding driving members.

FIG. 6B is a schematic side cross-sectional view of an imaging unit after attaching electrodes to a driving member, and wire-bonding the imaging die to the support member and the electrodes.

DETAILED DESCRIPTION

A. Overview

Figure 1:
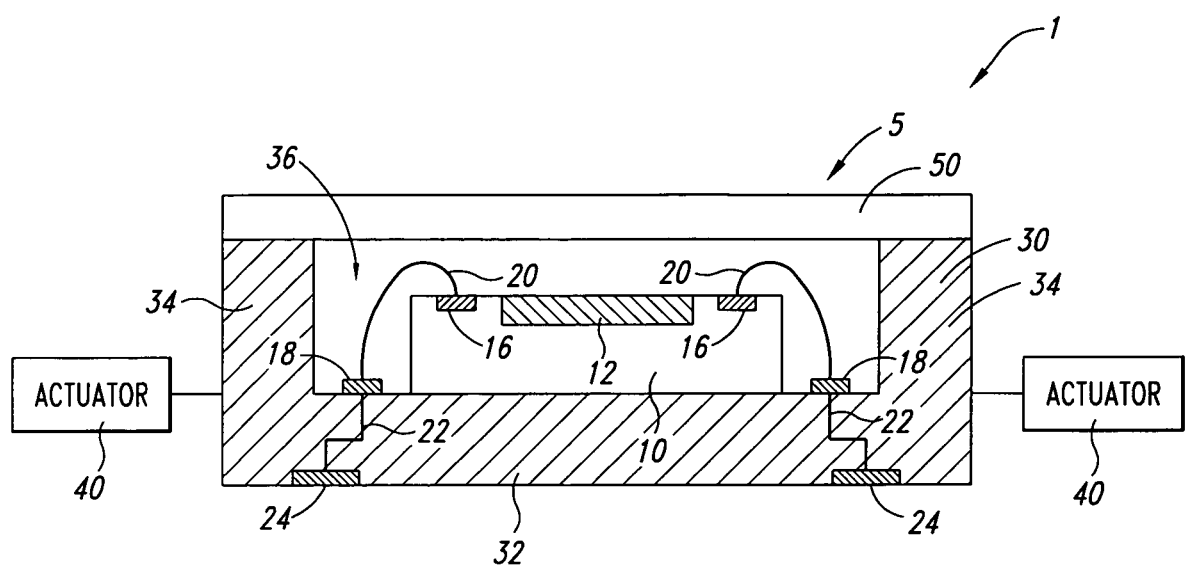
FIG. 1 is a schematic side cross-sectional view of a conventional microelectronic imaging assembly in accordance with the prior art.

The following disclosure describes several embodiments of microelectronic imaging units and methods for manufacturing microelectronic imaging units. One embodiment of an imaging unit includes a support member, an imaging die attached to the support member, and a driving member attached to the imaging die and the support member. The imaging die includes an image sensor, an integrated circuit operably coupled to the image sensor, and a plurality of external contacts operably coupled to the integrated circuit. The driving member is configured to selectively move the imaging die relative to the support member. For example, the driving member can include a piezoelectric crystal, a piezoelectric tape, or another suitable member.

Another embodiment of a microelectronic imaging unit includes a support member, an imaging die attached to the support member, first and second piezoelectric driving members positioned between the imaging die and the support member, and a cover attached to the support member. The support member includes a base and a stand-off projecting from the base, and the cover is attached to the stand-off and positioned over the image sensor. The imaging die includes an image sensor, an integrated circuit operably coupled to the image sensor, and a plurality of external contacts operably coupled to the integrated circuit. The image sensor has a plurality of pixels defining a focal plane. The first piezoelectric driving member is positioned to selectively move the imaging die along a first axis in the focal plane, and the second piezoelectric driving member is positioned to selectively move the imaging die along a second axis in the focal plane. The first axis is transverse to the second axis.

Another aspect of the invention is directed to methods for manufacturing a microelectronic imaging unit. One embodiment of such a method includes coupling an imaging die to a support member. The imaging die includes an image sensor, an integrated circuit operably coupled to the image sensor, and a plurality of external contacts operably coupled to the integrated circuit. The image sensor has a plurality of pixels defining a focal plane. The method further includes wire-bonding the external contacts of the imaging die to corresponding terminals on the support member, and attaching a plurality of driving members to the imaging die and the support member so that the driving members can selectively move the imaging die in the focal plane relative to the support member.

Another aspect of the invention is directed to methods of operating an imaging unit in an electronic device. In one embodiment, a method includes providing an imaging unit having an imaging die attached to a support member. The imaging die includes an image sensor, an integrated circuit operably coupled to the image sensor, and a plurality of external contacts operably coupled to the integrated circuit. The image sensor has a plurality of pixels defining a focal plane. The method further includes selectively moving the imaging die in the focal plane from a first position to a second position relative to the support member. The method may also include measuring a first intensity of light impinging upon the pixels at the first position and measuring a second intensity of light impinging upon the pixels at the second position.

Specific details of several embodiments of the invention are described below with reference to CMOS imaging units to provide a thorough understanding of these embodiments, but other embodiments can use CCD imaging units or other types of solid-state imaging devices. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, the invention may have other embodiments with additional elements or without several of the elements described below with reference to FIGS. 2A–6B.

B. Embodiments of Methods for Manufacturing Microelectronic Imaging Units

Figure 2A:
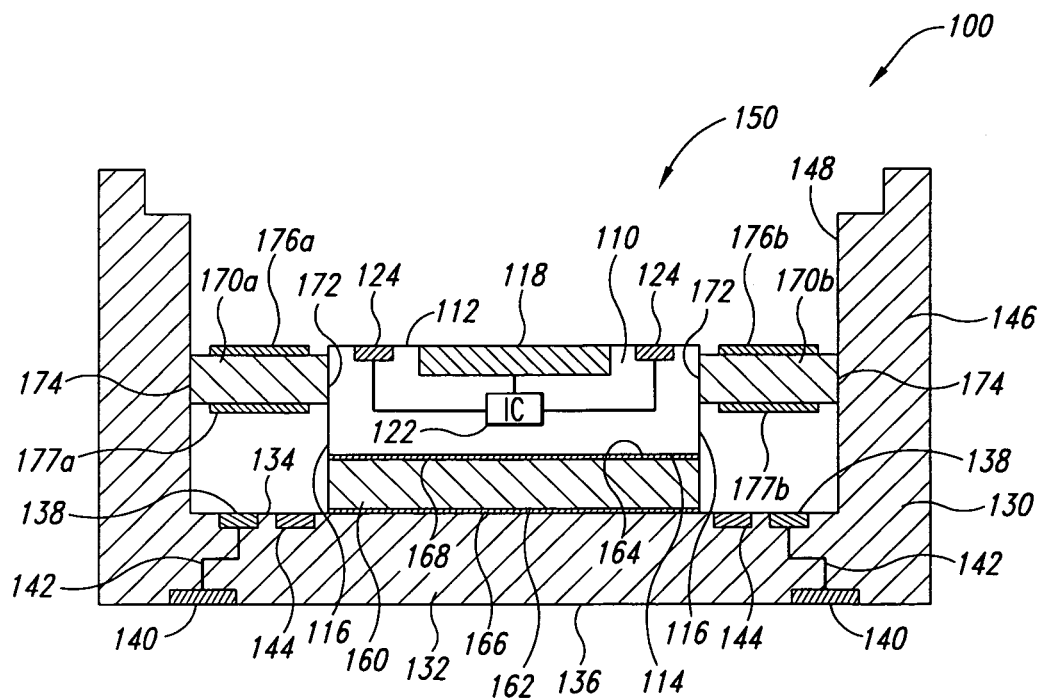

FIGS. 2A–3B illustrate stages of a method for manufacturing a microelectronic imaging unit 100 in accordance with one embodiment of the invention. FIG. 2A, for example, is a schematic side cross-sectional view of a microelectronic imaging unit 100 having an imaging die 110, a support member 130, and a flexible member 160 attached between the imaging die 110 and the support member 130. The imaging die 110 includes a first side 112, a second side 114 opposite the first side 112, and a plurality of ends 116 extending from the first side 112 to the second side 114. The imaging die 110 further includes an image sensor 118, an integrated circuit 122 (shown schematically) operably coupled to the image sensor 118, and a plurality of external contacts 124 (e.g., bond-pads) operably coupled to the integrated circuit 122. The image sensor 118 can be a CMOS device or a CCD image sensor for capturing pictures or other images in the visible spectrum. The image sensor 118 may also detect radiation in other spectrums (e.g., IR or UV ranges).

The support member 130 can be a lead frame or a substrate, such as a printed circuit board, for carrying the imaging die 110. In the illustrated embodiment, the support member 130 includes a base 132, a stand-off 146 projecting from the base 132, and a recess 150 defined by the base 132 and stand-off 146 for receiving the imaging die 110. The base 132 includes a first side 134 having a plurality of first terminals 138 and a plurality of second terminals 144, and a second side 136 having a plurality of pads 140. The first terminals 138 can be arranged in an array for attachment to corresponding external contacts 124 of the die 110, and the pads 140 can be arranged in an array for attachment to a plurality of conductive couplers (e.g., solder balls). The support member 130 further includes a plurality of conductive traces 142 electrically coupling the first terminals 138 to corresponding pads 140. In other embodiments, the support member 130 may include a plurality of leads in lieu of the pads 140. Moreover, in additional embodiments, such as the embodiment described below with reference to FIGS. 6A and 6B, the base 132 and stand-off 146 may not be integral members of the same unit, but rather the stand-off 146 can be formed on the base 132.

The flexible member 160 includes a first surface 162 attached to the first side 134 of the base 132 with an adhesive 166 and a second surface 164 attached to the second side 114 of the imaging die 110 with an adhesive 168. The adhesives 166 and 168 can be an adhesive film, epoxy, or other suitable material. The flexible member 160 allows the imaging die 110 to move relative to the support member 130 within the recess 150. The flexible member 160, for example, can be rubber or another suitable elastic or flaccid member.

Figure 2B:
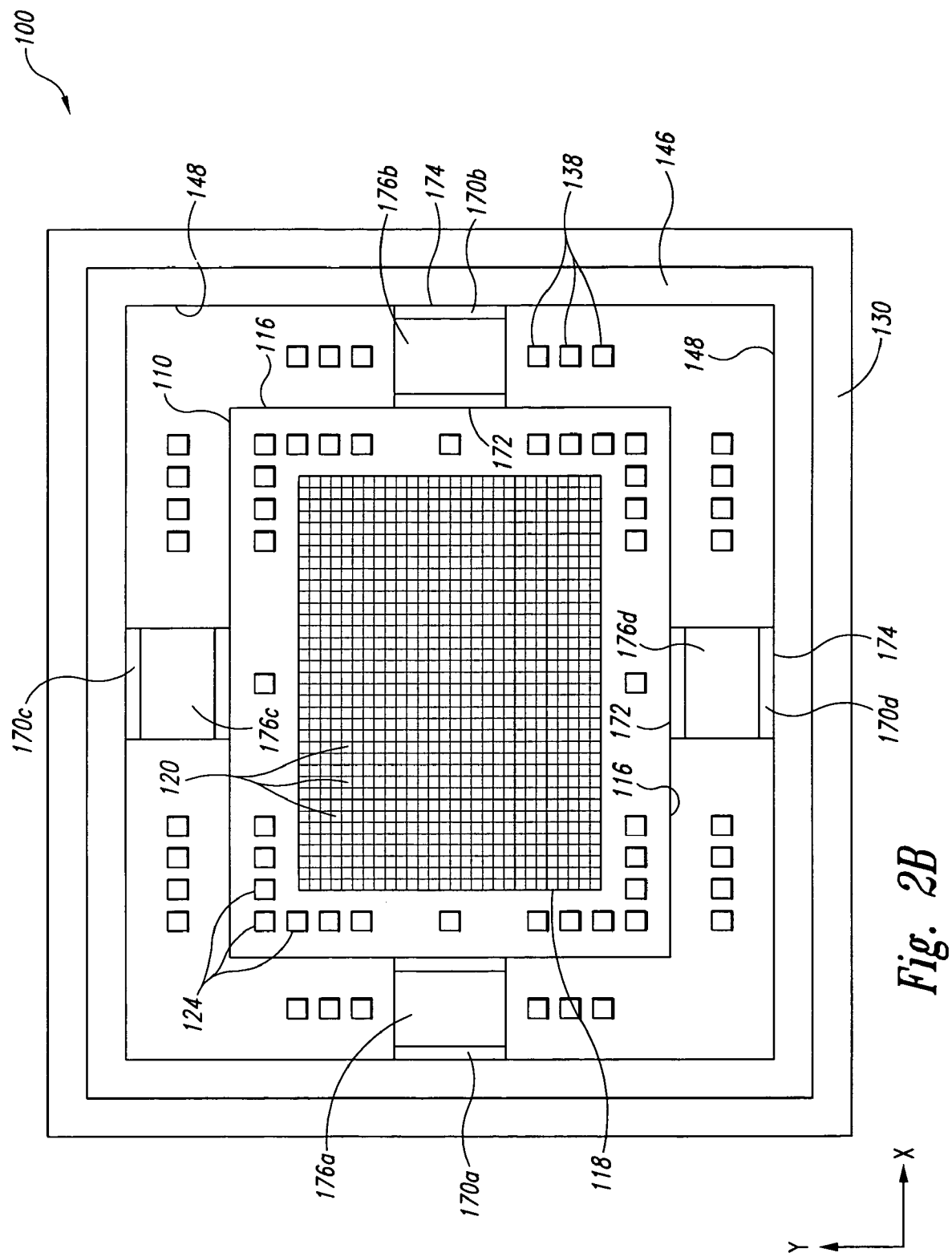
FIG. 2B is a top plan view of the imaging unit illustrated in FIG. 2A.

FIG. 2B is a top plan view of the imaging unit 100 illustrated in FIG. 2A. Referring to both FIGS. 2A and 2B, after attaching the imaging die 110 to the support member 130 with the flexible member 160 positioned between the imaging die 110 and the support member 130, a plurality of drivers 170 are coupled to the imaging die 110 and the support member 130. The illustrated drivers 170 include a first end 172 attached to a corresponding end 116 of the imaging die 110 and a second end 174 attached to an interior wall 148 of the stand-off 146. In the illustrated embodiment, first and second drivers 170a–b are positioned to move the imaging die 110 along a first axis X (FIG. 2B) in a focal plane defined by the image sensor 118, and third and fourth drivers 170c–d (FIG. 2B) are positioned to move the imaging die 110 along a second axis Y (FIG. 2B) in the focal plane. In additional embodiments, the imaging unit 100 can include a different number of drivers 170, such as only the first and third drivers 170a and 170c or only the second and fourth drivers 170b and 170d along transverse axes. The drivers 170 can be piezoelectric actuators, such as piezoelectric crystals, piezoelectric tapes (e.g., piezoelectric Teflon®), or other suitable piezoelectric elements for moving the imaging die 110. In other embodiments, the drivers 170 can include micro-mechanical motors or other suitable non-piezoelectric drivers.

When the drivers 170 are piezoelectric actuators, the imaging unit 100 further includes a plurality of first and second electrodes 176 and 177 carried by the drivers 170. The electrodes 176 and 177 are positioned to selectively apply a voltage across a selected driver(s) 170 to expand/contract the driver(s) 170 and move the imaging die 110 in a desired direction relative to the support member 130. The electrodes 176 and 177 are attached to the drivers 170 such that the drivers 170 can expand and/or contract without detaching the electrodes 176 and 177. In the illustrated imaging unit 100, one first electrode 176 and one second electrode 177 are coupled to each driver 170, and each pair of first and second electrodes 176 and 177 is operable independent of the other electrodes 176 and 177 so that the drivers 170 can expand independently of each other. In other embodiments, the imaging unit 100 can have a different number of electrodes 176 and 177 attached to each driver 170.

Figure 3A:
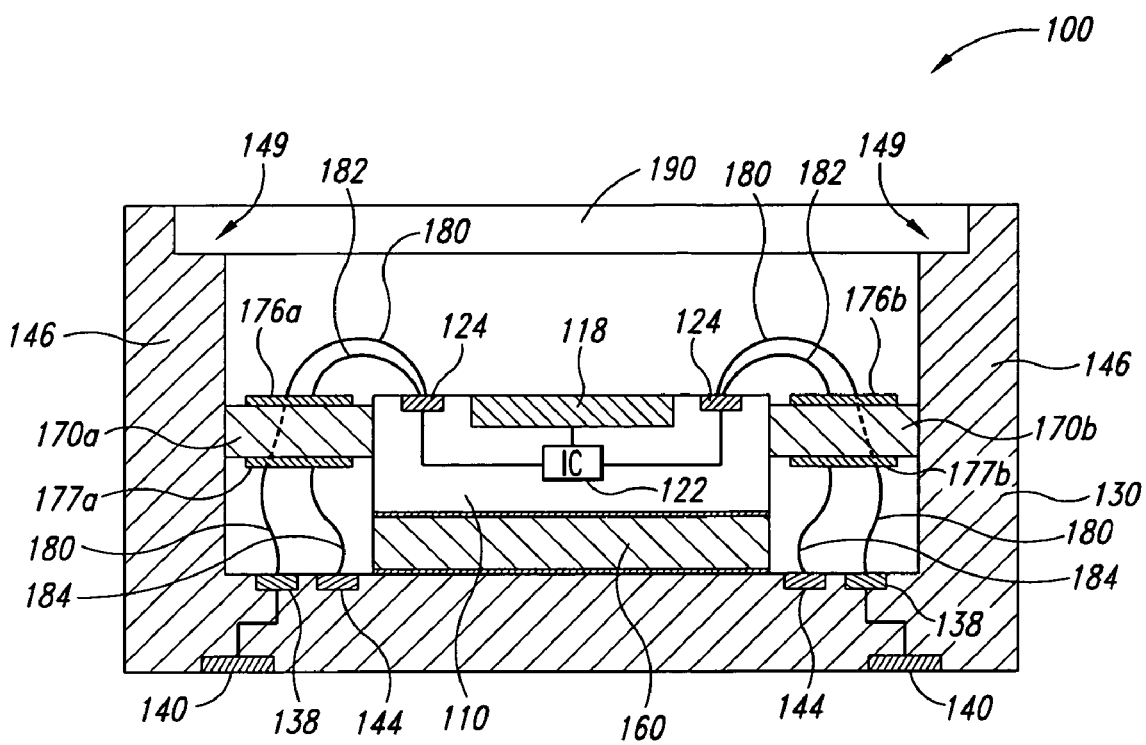
FIG. 3A is a schematic side cross-sectional view of the imaging unit after wire-bonding external contacts of the die to corresponding terminals or electrodes, and attaching a cover to the support member.
Figure 3B:
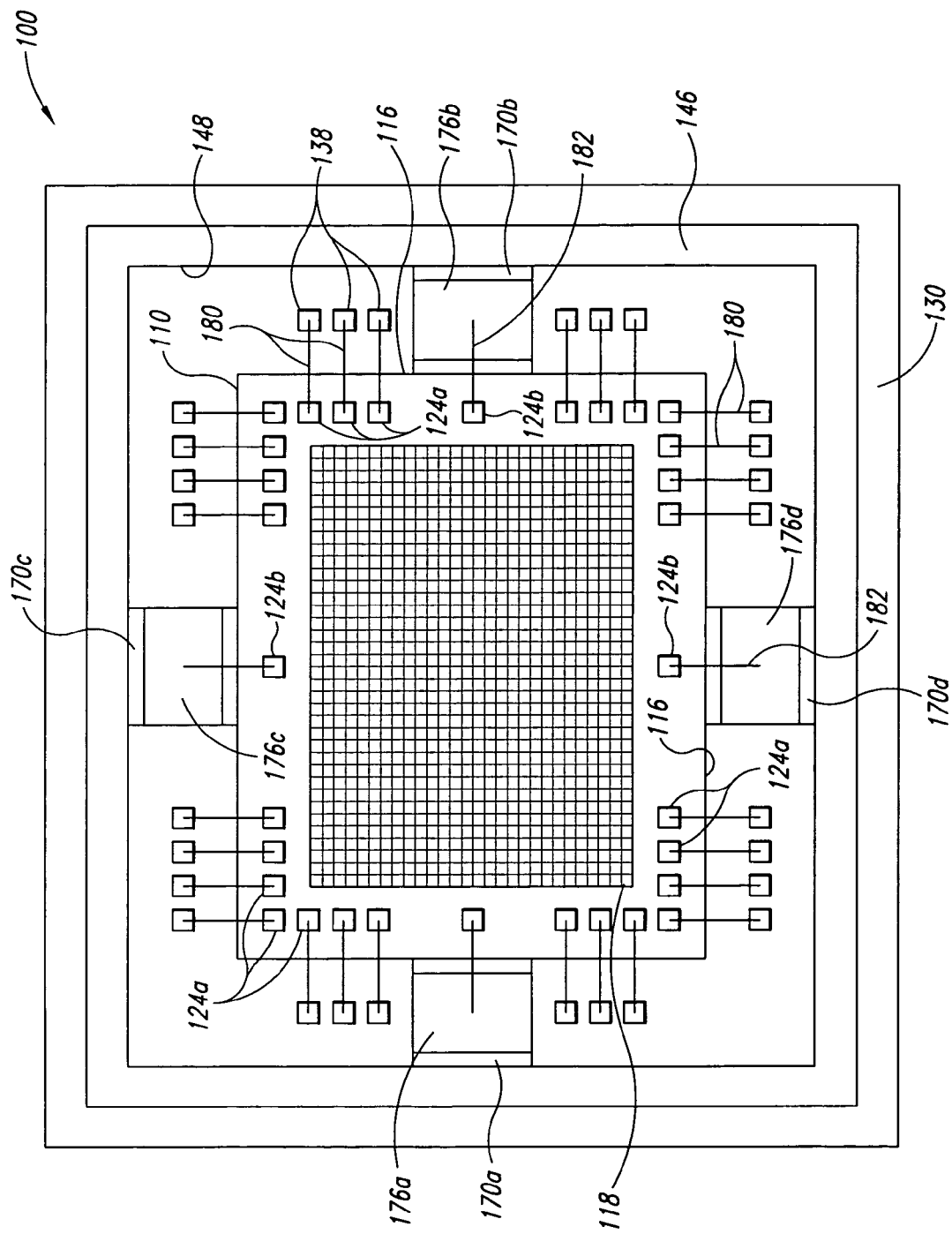

FIG. 3A is a schematic side cross-sectional view of the imaging unit 100 after (a) wire-bonding the external contacts 124 to corresponding first terminals 138 or corresponding first electrodes 176, and (b) attaching a cover 190 to the stand-off 146. FIG. 3B is a top plan view of the imaging unit 100 illustrated in FIG. 3A. Referring to both FIGS. 3A and 3B, a plurality of first wire-bonds 180 extend between first external contacts 124a and corresponding first terminals 138, a plurality of second wire-bonds 182 extend between second external contacts 124b and corresponding first electrodes 176, and a plurality of third wire-bonds 184 (FIG. 3A) extend between the second electrodes 177 (FIG. 3A) and corresponding second terminals 144 (FIG. 3A). The first wire-bonds 180 accordingly electrically connect the pads 140 on the support member 130 to the integrated circuit 122 (FIG. 3A) of the imaging die 110, and the second wire-bonds 182 accordingly electrically connect the first electrodes 176 to the integrated circuit 122. The first, second, and third wire-bonds 180, 182, and 184 can be made of gold or another flexible or ductile material so that the wire-bonds 180, 182, and 184 flex as the drivers 170 move the imaging die 110.

In the illustrated embodiment, the second terminals 144 (FIG. 3A) are electrically coupled to each other and ground the second electrodes 177. As a result, the integrated circuit 122 (FIG. 3A) can control the movement of the imaging die 110 by adjusting and/or applying an electrical charge to a selected first electrode 176 to vary and/or create a voltage differential between the selected first electrode 176 and the corresponding grounded second electrode 177. Changes in the voltage differential across the selected driver 170 cause the selected driver 170 to expand/contract and move the imaging die 110. For example, in the illustrated imaging unit 100, the integrated circuit 122 generates a baseline voltage differential between the first and second electrodes 176 and 177 on each driver 170. The integrated circuit 122 can move the imaging die 110 by decreasing the voltage differential between first and second electrodes 176a and 177a to cause the first driver 170a to contract, and increasing the voltage differential between first and second electrodes 176b and 177b to cause the second driver 170b to expand.

Figure 4:
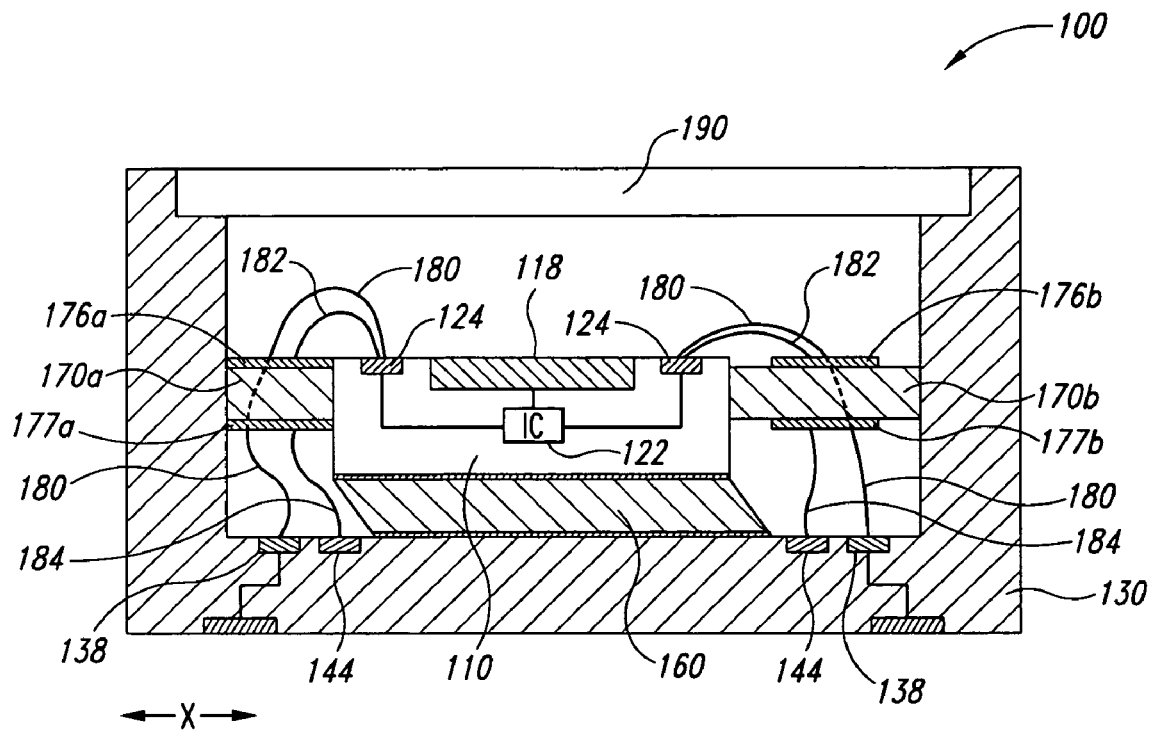
FIG. 4 is a schematic side cross-sectional view of the imaging unit after moving the imaging die relative to the support member.

FIG. 4 is a schematic side cross-sectional view of the imaging unit 100 after contracting the first driver 170a and expanding the second driver 170b to move the imaging die 110 along the first axis X. The imaging die 110 returns to its original position when the integrated circuit 122 applies the original voltage to the first electrodes 176a–b so that the first and second drivers 170a–b expand and contract, respectively, to their original configuration. In other embodiments, such as the embodiment described below with reference to FIGS. 6A and 6B, the support member 130 may not include the second terminals 144 for grounding the second electrodes 176b, but rather both the first and second electrodes 176a–b can be wire-bonded to corresponding external contacts 124 on the imaging die 110.

Referring back to FIG. 3A, in the illustrated embodiment, the cover 190 is attached to the stand-off 146 and positioned over the image sensor 118. The stand-off 146 may include an alignment feature 149 to center the cover 190 and space the cover 190 apart from the image sensor 118 a desired distance. In other embodiments, however, the cover 190 may be attached to a flat top surface on the stand-off 146. The cover 190 can be a glass, quartz, or another suitable material that is transmissive to the desired spectrum of radiation. The cover 190, for example, can further include one or more anti-reflective films and/or filters.

C. Operation of the Microelectronic Imaging Units

The imaging unit 100 can increase the resolution of the images captured by digital cameras, cell phones, Personal Digital Assistants, and other electronic devices. For example, several embodiments of the integrated circuit 122 operate as a controller and contain an algorithm for actuating the drivers 170. More specifically, because each pixel on the image sensor 118 can sense only a single color (i.e., red, green, or blue), the integrated circuit 122 operates one or more of the drivers 170 to move the imaging die 110 so that each pixel on the image sensor 118 is exposed to light at several different locations each time a user wishes to capture an image. The measurements from the different pixels at each specific location are then combined in an algorithm to determine the color at the location. This process is described in greater detail below with reference to FIGS. 5A–5D.

Figure 5A:
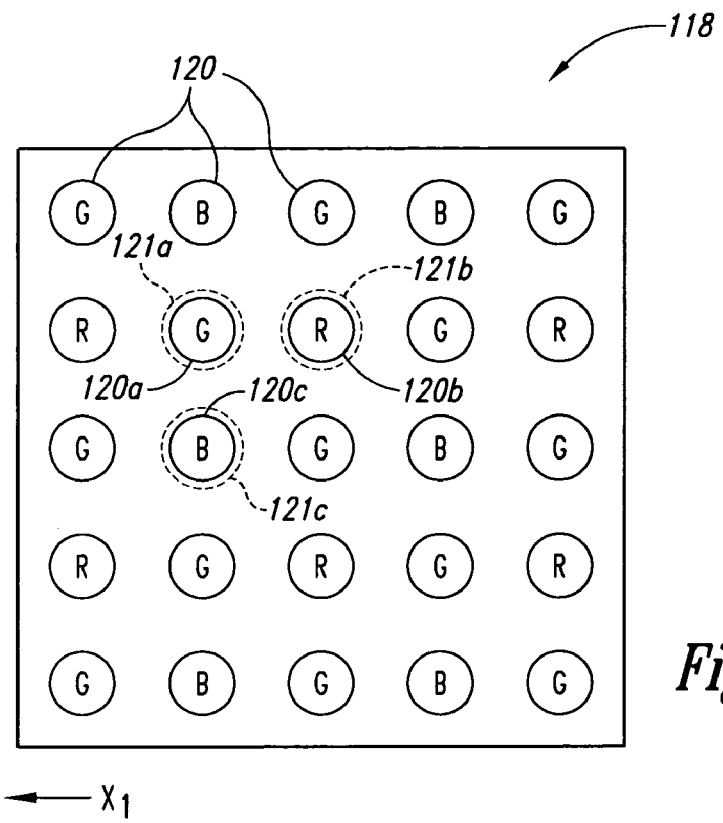
FIGS. 5A–5D are schematic top plan views of a plurality of pixels on an image sensor of the imaging die in different positions illustrating the operation of an imaging unit in accordance with an embodiment of the invention.

FIG. 5A is a schematic top plan view of a portion of the image sensor 118 having a plurality of pixels 120 arranged in a conventional Bayer pattern. To capture an image, each pixel 120 measures the intensity of the light that corresponds to its specific filter. For example, a first pixel 120a measures the intensity of the green light impinging upon the first pixel 120a at a first location 121a, a second pixel 120b measures the intensity of the red light impinging upon the second pixel 120b at a second location 121b, and a third pixel 120c measures the intensity of the blue light impinging upon the third pixel 120c at a third location 121c. After the pixels 120 measure the light intensity at a first position, at least one of the drivers 170 (FIG. 3A) moves the imaging die 110 and the pixels 120 in a direction $X_1$ from the first position to a second position.

Figure 5B:
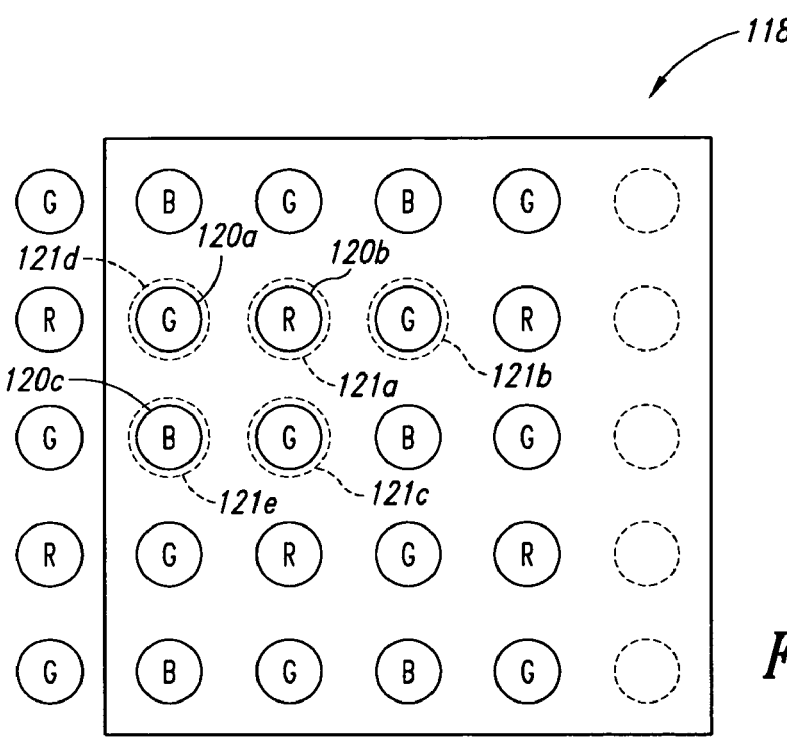

FIG. 5B is a schematic top plan view of the portion of the image sensor 118 in the second position after moving in the direction $X_1$ (FIG. 5A). In the second position, each pixel 120 measures the intensity of the light that corresponds to its specific filter. For example, the first pixel 120a measures the intensity of the green light impinging upon the first pixel 120a at a fourth location 121d, the second pixel 120b measures the intensity of the red light impinging upon the second pixel 120b at the first location 121a, and the third pixel 120c measures the intensity of the blue light impinging upon the third pixel 120c at a fifth location 121e. After the pixels 120 measure the light intensity at the second position, at least one of the drivers 170 (FIG. 3A) moves the imaging die 110 and the pixels 120 in a direction $Y_1$ from the second position to a third position.

Figure 5C:
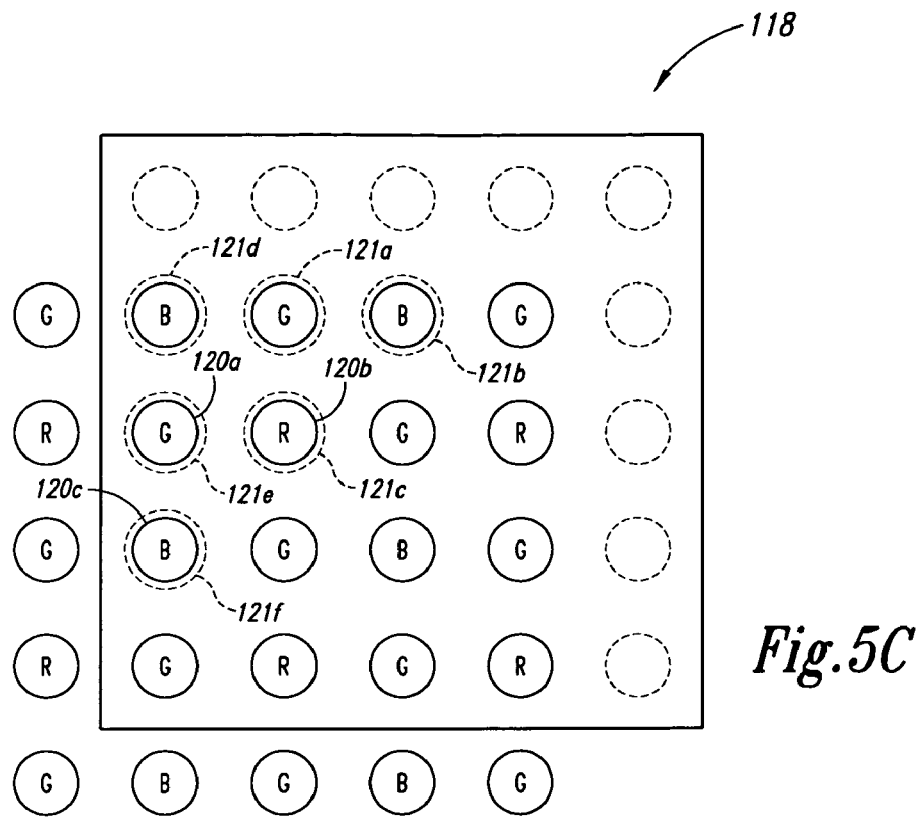

FIG. 5C is a schematic top plan view of the portion of the image sensor 118 in the third position after moving in the direction $Y_1$ (FIG. 5B). In the third position, each pixel 120 measures the intensity of the light that corresponds to its specific filter. For example, the first pixel 120a measures the intensity of the green light impinging upon the first pixel 120a at the fifth location 121e, the second pixel 120b measures the intensity of the red light impinging upon the second pixel 120b at the third location 121c, and the third pixel 120c measures the intensity of the blue light impinging upon the third pixel 120c at a sixth location 121f. After the pixels 120 measure the light intensity at the third position, at least one of the drivers 170 (FIG. 3A) moves the imaging die 110 and the pixels 120 in a direction $X_2$ from the third position to a fourth position.

Figure 5D:
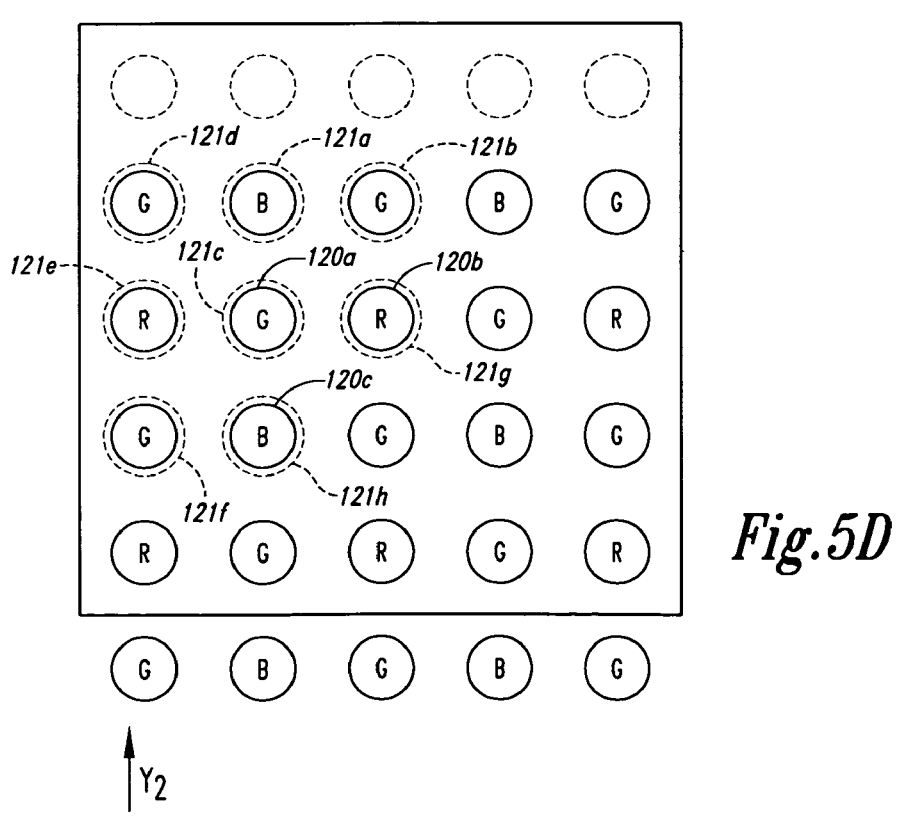

FIG. 5D is a schematic top plan view of the portion of the image sensor 118 in the fourth position after moving in the direction $X_2$ (FIG. 5C). In the fourth position, each pixel 120 measures the intensity of the light that corresponds to its specific filter. For example, the first pixel 120a measures the intensity of the green light impinging upon the first pixel 120a at the third location 121c, the second pixel 120b measures the intensity of the red light impinging upon the second pixel 120b at a seventh location 121g, and the third pixel 120c measures the intensity of the blue light impinging upon the third pixel 120c at an eighth location 121h. After the pixels 120 measure the light intensity at the fourth position, at least one of the drivers 170 (FIG. 3A) moves the imaging die 110 and the pixels 120 in a direction $Y_2$ from the fourth position to the first position.

After the pixels 120 measure the light intensity at the four positions, the integrated circuit 122 uses an algorithm to determine the color at each location based on the four light intensity measurements taken by different pixels 120 at each specific location. In additional embodiments, the integrated circuit 122 may determine the color at each location with more or less than four measurements. For example, the image sensor 118 may move along a single axis between the first position illustrated in FIG. 5A and the second position illustrated in FIG. 5B, and the integrated circuit 122 may determine the color at each pixel location based on two light intensity measurements. Moreover, in the illustrated embodiment, the drivers 170 move the imaging die 110 a distance equal to the pixel pitch so that the image sensor 118 measures the light intensity at each specific location with four different pixels. In other embodiments, however, the drivers 170 can move the imaging die 110 a distance that is more or less than the pixel pitch. For example, the driver(s) 170 can move the imaging die 110 a distance equal to one-half of the pixel pitch so that the pixels 120 measure the light intensity at locations between their original locations to further increase the resolution.

One feature of the imaging unit 100 illustrated in FIGS. 2A–5D is that the drivers 170 can selectively move the imaging die 110 relative to the support member 130. An advantage of this feature is that the image unit 100 can capture higher resolution images without significantly increasing the footprint of the unit 100. For example, the footprint of the imaging unit 100 is the surface area of the base 132 of the support member 130. By contrast, in prior art devices, such as the imaging assembly 1 illustrated in FIG. 1, the actuators 40 are outboard the imaging unit 5, and the surface area of the imaging assembly 1 is significantly larger than the surface area of the imaging unit 5.

Another feature of the imaging unit 100 illustrated in FIGS. 2A–5D is that the drivers 170 move only the imaging die 110 and do not move the support member 130. An advantage of this feature is that the drivers 170 can move the imaging die 110 faster because the drivers 170 are moving less mass. Moving the imaging die 110 faster increases the accuracy of the captured image if the imaged object is moving. By contrast, in prior art devices, such as the imaging assembly 1 illustrated in FIG. 1, the actuators 40 move the entire imaging unit 5, which has a much greater mass than the imaging die 10.

D. Additional Embodiments of Methods for Manufacturing Microelectronic Imaging Units FIGS. 6A and 6B illustrate stages of a method for manufacturing a plurality of imaging units 200 in accordance with another embodiment of the invention. FIG. 6A, for example, is a schematic side cross-sectional view of a microfeature workpiece 202 having a support member 230, a plurality of drivers 270 attached to the support member 230, and a plurality of imaging dies 110 attached to corresponding drivers 270. The support member 230 can be a lead frame or a substrate, such as a printed circuit board, for carrying the imaging dies 110. In the illustrated embodiment, the support member 230 includes a first side 234 having a plurality of terminals 238 and a second side 236 having a plurality of pads 240. The terminals 238 can be arranged in arrays for attachment to corresponding external contacts 124 on the imaging dies 110, and the pads 240 can be arranged in arrays for attachment to a plurality of conductive couplers (e.g., solder balls). The support member 230 further includes a plurality of conductive traces 242 electrically coupling the terminals 238 to corresponding pads 240.

The drivers 270 are attached to the first side 234 of the support member 230 with an adhesive 266 and can be arranged in pairs (only one driver 270 in each pair is shown in FIG. 6A) relative to a corresponding array of terminals 238 so that each pair of drivers 270 can move the associated imaging die 110 along two orthogonal axes. The imaging dies 110 are attached to corresponding pairs of drivers 270 with an adhesive 268. Drivers 270 can alternatively be applied on the entire wafer prior to sensor dicing in an additional wafer processing step. Although in the illustrated embodiment the individual imaging dies 110 are attached to two drivers 270, in other embodiments, the individual dies 110 can be attached to a different number of drivers 270. In either case, after attaching the imaging dies 110 to the driver 270, the workpiece 202 can be cut along lines A—A to singulate the individual imaging units 200.

FIG. 6B is a schematic side cross-sectional view of the imaging unit 200 after (a) attaching a plurality of first and second electrodes 276 and 277 to the drivers 270, and (b) wire-bonding the imaging die 110 to the support member 230 and the electrodes 276 and 277. The electrodes 276 and 277 can be attached to one or more ends 272 of the drivers 270. For example, the first electrodes 276 (only one shown in FIG. 6B) can be attached to a first end 272a of a corresponding driver 270 and the second electrodes 277 (only one shown in FIG. 6B) can be attached to a second end 272b of the driver 270. The electrodes 276 and 277 are accordingly positioned to selectively apply a voltage across a selected driver(s) 270 and move the imaging die 110 in a desired direction relative to the support member 230. The imaging unit 200 further includes a plurality of wire-bonds 282 electrically connecting the first and second electrodes 276 and 277 to corresponding external contacts 124 on the imaging die 110 so that the integrated circuit 122 can control the movement of the imaging die 110 by generating a voltage differential between a selected pair of first and second electrodes 276 and 277. The imaging unit 200 also includes a plurality of wire-bonds 180 electrically coupling the external contacts 124 to corresponding terminals 238 on the support member 230.

Before and/or after wire-bonding the imaging die 110 to the support member 230, a stand-off 246 is formed on the first side 234 of the support member 230 outboard the terminals 238. The stand-off 246 projects a distance D from the support member 230 to support a cover 290 at a desired distance over the image sensor 118. The stand-off 246 can be formed by transfer molding, stereolithography, stencil printing, screen printing, or other suitable processes. After forming the stand-off 246, the cover 290 is attached to the stand-off 246 and positioned over the image sensor 118. Although in the illustrated method, the imaging die 110 is wire-bonded, the electrodes 276 and 277 are attached, the stand-off 246 is formed, and the cover 290 is attached after singulation, in other embodiments, one or more of these processes can be performed at the wafer level before singulation.

One advantage of the method for manufacturing imaging units 200 illustrated in FIGS. 6A and 6B is that the method is expected to significantly enhance the efficiency of the manufacturing process because a plurality of imaging units 200 can be fabricated simultaneously using highly accurate and efficient processes developed for packaging and manufacturing semiconductor devices. This method of manufacturing imaging units 200 is also expected to enhance the quality and performance of the imaging units 200 because the semiconductor fabrication processes can reliably produce and assemble the various components with a high degree of precision. As such, several embodiments of the method are expected to significantly reduce the cost for assembling microelectronic imaging units 200, increase the performance of the imaging units 200, and produce higher quality imaging units 200.

From the foregoing, it will be appreciated that specific embodiments of the invention have been described herein for purposes of illustration, but that various modifications may be made without deviating from the spirit and scope of the invention. For example, the microelectronic imaging units can have any combination of the features described above and can be manufactured using any combination of the steps described above. Accordingly, the invention is not limited except as by the appended claims.

I claim:

1. A microelectronic imaging unit, comprising:
   a support member;
   an imaging die attached to the support member, the imaging die comprising an image sensor, an integrated circuit operably coupled to the image sensor, and a plurality of external contacts operably coupled to the integrated circuit; and
   a driving member attached to the imaging die and the support member, the driving member configured to selectively move the imaging die relative to the support member.

2. The imaging unit of claim 1 wherein the driving member comprises a piezoelectric driving member.

3. The imaging unit of claim 1 wherein the driving member comprises a piezoelectric driving member, and wherein the imaging unit further comprises an electrode attached to the piezoelectric driving member and electrically coupled to the integrated circuit on the imaging die.

4. The imaging unit of claim 1 wherein the imaging die further comprises a first side having the image sensor and a second side opposite the first side, and wherein the driving member is attached between the second side of the imaging die and the support member.

5. The imaging unit of claim 1 wherein the imaging die further comprises a first side having the image sensor, a second side opposite the first side, and a plurality of ends extending between the first and second sides, and wherein the driving member is attached between one of the ends of the imaging die and the support member.

6. The imaging unit of claim 1 wherein the driving member is a first driving member positioned to selectively move the imaging die along a first axis in a focal plane, wherein the imaging unit further comprises a second driving member attached to the imaging die and the support member and positioned to selectively move the imaging die along a second axis in the focal plane, and wherein the first axis is transverse to the second axis.

7. The imaging unit of claim 1 wherein the support member comprises a base and a stand-off projecting from the base, and wherein the imaging unit further comprises a cover attached to the stand-off and positioned over the image sensor.

8. The imaging unit of claim 1 wherein the support member comprises an array of terminals, and wherein the imaging unit further comprises a plurality of wire-bonds electrically connecting the external contacts on the die to corresponding terminals on the support member.

9. The imaging unit of claim 1 wherein the image sensor comprises a plurality of pixels defining a focal plane, and wherein the driving member is configured to selectively move the imaging die in the focal plane.

10. The imaging unit of claim 1 wherein the support member comprises a support substrate with a plurality of terminals and a plurality of external contacts electrically coupled to corresponding terminals, and wherein the terminals are electrically coupled to corresponding external contacts on the imaging die.

11. The imaging unit of claim 1, further comprising a flexible member between the imaging die and the support member.

12. A microelectronic imaging unit, comprising:
   a support member having an array of terminals;
   an imaging die attached to the support member, the imaging die comprising an image sensor, an integrated circuit operably coupled to the image sensor, and a plurality of external contacts operably coupled to the integrated circuit, the image sensor including a plurality of pixels defining a focal plane;
   a plurality of wire-bonds electrically connecting the external contacts to corresponding terminals on the support member; and
   a plurality of driving members attached to the imaging die and the support member for moving the imaging die in the focal plane relative to the support member.

13. The imaging unit of claim 12 wherein the driving members comprise a plurality of piezoelectric driving members.

14. The imaging unit of claim 12 wherein the driving members comprise a plurality of piezoelectric driving members, and wherein the imaging unit further comprises a plurality of electrodes attached to corresponding piezoelectric driving members and electrically coupled to the integrated circuit on the imaging die.

15. The imaging unit of claim 12 wherein the driving members comprise a first driving member positioned to selectively move the imaging die along a first axis in the focal plane and a second driving member positioned to selectively move the imaging die along a second axis in the focal plane, and wherein the first axis is transverse to the second axis.

16. The imaging unit of claim 12, further comprising a flexible member between the imaging die and the support member.

17. The imaging unit of claim 12 wherein the imaging die further comprises a first side having the image sensor and a second side opposite the first side, and wherein at least one of the driving members is attached between the second side of the imaging die and the support member.

18. The imaging unit of claim 12 wherein the imaging die further comprises a first side having the image sensor, a second side opposite the first side, and a plurality of ends extending between the first and second sides, and wherein at least one of the driving members is attached between an end of the imaging die and the support member.

19. A microelectronic imaging unit, comprising:
a support member having a base and a stand-off projecting from the base;
an imaging die attached to the support member, the imaging die comprising an image sensor, an integrated circuit operably coupled to the image sensor, and a plurality of external contacts operably coupled to the integrated circuit, the image sensor including a plurality of pixels defining a focal plane;
a cover attached to the stand-off and positioned over the image sensor;
a first piezoelectric driving member positioned between the imaging die and the support member to selectively move the imaging die along a first axis in the focal plane; and
a second piezoelectric driving member positioned between the imaging die and the support member to selectively move the imaging die along a second axis in the focal plane, wherein the first axis is transverse to the second axis.

20. The imaging unit of claim 19, further comprising:
a first electrode attached to the first piezoelectric driving member;
a second electrode attached to the second piezoelectric driving member; and
a plurality of wire-bonds electrically coupling the first and second electrodes to corresponding external contacts on the imaging die.

21. The imaging unit of claim 19 wherein the imaging die further comprises a first side having the image sensor and a second side opposite the first side, and wherein the first and second piezoelectric driving members are attached between the second side of the imaging die and the support member.

22. The imaging unit of claim 19 wherein the imaging die further comprises a first side having the image sensor, a second side opposite the first side, and a plurality of ends extending between the first and second sides, and wherein the first and second piezoelectric driving members are attached between the support member and corresponding ends of the imaging die.

23. The imaging unit of claim 19 wherein the support member further comprises an array of terminals, and wherein the imaging unit further comprises a plurality of wire-bonds electrically connecting the external contacts to corresponding terminals on the support member.

24. The imaging unit of claim 19, further comprising a flexible member between the imaging die and the support member.

25. A microelectronic imaging unit, comprising:
a support substrate;
an imaging die attached to the support substrate, the imaging die comprising an image sensor, an integrated circuit operably coupled to the image sensor, and a plurality of external contacts operably coupled to the integrated circuit, the image sensor including a plurality of pixels defining a focal plane; and
means for selectively moving the imaging die in the focal plane relative to the support substrate.

26. The imaging unit of claim 25 wherein the means for selectively moving the imaging die comprise a plurality of piezoelectric driving members attached to the imaging die and the support substrate.

27. The imaging unit of claim 25 wherein the means for selectively moving the imaging die comprise a first driving member positioned to selectively move the imaging die along a first axis in the focal plane and a second driving member positioned to selectively move the imaging die along a second axis in the focal plane, and wherein the first axis is transverse to the second axis.

28. The imaging unit of claim 25 wherein the imaging die further comprises a first side having the image sensor and a second side opposite the first side, and wherein at least a portion of the means for selectively moving the imaging die is attached between the second side of the imaging die and the support substrate.

29. The imaging unit of claim 25 wherein the imaging die further comprises a first side having the image sensor, a second side opposite the first side, and a plurality of ends extending between the first and second sides, and wherein at least a portion of the means for selectively moving the imaging die is attached between one of the ends of the imaging die and the support substrate.

30. The imaging unit of claim 25 wherein the support substrate comprises an array of terminals, and wherein the imaging unit further comprises a plurality of wire-bonds electrically connecting the external contacts on the die to corresponding terminals on the support substrate.

31. The imaging unit of claim 25, further comprising a flexible member between the imaging die and the support substrate.

32. A microelectronic imaging unit, comprising:
a support member having an array of terminals;
an imaging die attached to the support member, the imaging die comprising an image sensor, an integrated circuit operably coupled to the image sensor, and a plurality of external contacts operably coupled to the integrated circuit, the image sensor including a plurality of pixels defining a focal plane;
a plurality of wire-bonds electrically connecting the external contacts to corresponding terminals on the support member;
a cover coupled to the support member and positioned over the image sensor;

a plurality of piezoelectric driving members positioned between the imaging die and the support member for selectively moving the imaging die in the focal plane; and a plurality of electrodes attached to corresponding piezoelectric driving members and electrically connected to the integrated circuit.

33. The imaging unit of claim 32 wherein the imaging die further comprises a first side having the image sensor and a second side opposite the first side, and wherein at least one of the piezoelectric driving members is attached between the second side of the imaging die and the support member.

34. The imaging unit of claim 32 wherein the imaging die further comprises a first side having the image sensor, a second side opposite the first side, and a plurality of ends extending between the first and second sides, and wherein at least one of the piezoelectric driving members is attached to one of the ends of the imaging die and the support member.

35. The imaging unit of claim 32 wherein the piezoelectric driving members comprise a first piezoelectric driving member positioned to selectively move the imaging die along a first axis in the focal plane and a second piezoelectric driving member positioned to selectively move the imaging die along a second axis in the focal plane, and wherein the first axis is transverse to the second axis.

36. The imaging unit of claim 32, further comprising a flexible member between the imaging die and the support member.

37. The imaging unit of claim 32 wherein the wire-bonds comprise a plurality of first wire-bonds, and wherein the imaging unit further comprises a plurality of second wire-bonds electrically connecting the electrodes to corresponding external contacts on the die.

38. A plurality of microelectronic imaging units, comprising:
a support member;
a plurality of piezoelectric driving members attached to the support member; and
a plurality of singulated imaging dies attached to corresponding piezoelectric driving members such that the driving members are positioned between the support member and the imaging dies, the individual imaging dies including an image sensor, an integrated circuit operably coupled to the image sensor, and a plurality of external contacts operably coupled to the integrated circuit.

39. The imaging units of claim 38, further comprising a plurality of electrodes coupled to corresponding piezoelectric driving members.

40. The imaging units of claim 38, further comprising:
a plurality of electrodes coupled to corresponding piezoelectric driving members; and
a plurality of wire-bonds electrically connecting the electrodes to corresponding external contacts on the imaging die.

41. The imaging units of claim 38 wherein the support member comprises a support substrate with a plurality of terminal arrays arranged relative to the imaging dies.

42. The imaging units of claim 38 wherein the support member comprises a support substrate with a plurality of terminal arrays arranged relative to the imaging dies, and wherein the imaging units further comprise a plurality of wire-bonds electrically connecting the external contacts to corresponding terminals.

43. The imaging units of claim 38, further comprising a barrier on the support member between adjacent imaging dies.

44. The imaging units of claim 38, further comprising:
a barrier on the support member between adjacent imaging dies; and
a plurality of covers attached to the barrier and positioned over corresponding image sensors.

45. A method for manufacturing a microelectronic imaging unit, the method comprising:
coupling an imaging die to a support member, the imaging die comprising an image sensor, an integrated circuit operably coupled to the image sensor, and a plurality of external contacts operably coupled to the integrated circuit; and
attaching a driving member to the imaging die and the support member so that the driving member can selectively move the imaging die in a focal plane relative to the support member.

46. The method of claim 45 wherein attaching the driving member comprises coupling a piezoelectric driving member to the imaging die and the support member.

47. The method of claim 45 wherein attaching the driving member comprises coupling a piezoelectric driving member to the imaging die and the support member, and wherein the method further comprises coupling an electrode to the piezoelectric driving member and electrically connecting the electrode to the integrated circuit on the imaging die.

48. The method of claim 45 wherein the imaging die further comprises a first side having the image sensor and a second side opposite the first side, and wherein coupling the imaging die to the support member comprises attaching the imaging die to the support member with the driving member positioned between the second side of the imaging die and the support member.

49. The method of claim 45 wherein the imaging die further comprises a first side having the image sensor, a second side opposite the first side, and a plurality of ends extending between the first and second sides, and wherein attaching the driving member to the imaging die and the support member comprises coupling the driving member between one of the ends of the imaging die and the support member.

50. The method of claim 45 wherein attaching the driving member to the imaging die and the support member comprises positioning a first driving member to selectively move the imaging die along a first axis in the focal plane, wherein the method further comprises attaching a second driving member to the imaging die and the support member such that the second driving member is positioned to selectively move the imaging die along a second axis in the focal plane, and wherein the first axis is transverse to the second axis.

51. The method of claim 45, further comprising mounting a cover to the support member with the cover positioned over the image sensor.

52. The method of claim 45, further comprising wire-bonding the external contacts to corresponding terminals on the support member.

53. The method of claim 45, further comprising attaching a flexible member between the imaging die and the support member.

54. A method for manufacturing a microelectronic imaging unit, the method comprising:
coupling an imaging die to a support member, the imaging die comprising an image sensor, an integrated circuit operably coupled to the image sensor, and a plurality of external contacts operably coupled to the integrated circuit, the image sensor including a plurality of pixels defining a focal plane;

wire-bonding the external contacts of the imaging die to corresponding terminals on the support member;

attaching first and second driving members to the imaging die and the support member so that the first driving member can selectively move the imaging die along a first axis in the focal plane relative to the support member and the second driving member can selectively move the imaging die along a second axis in the focal plane relative to the support member, wherein the second axis is transverse to the first axis; and mounting a cover to the support member such that the cover is positioned over the image sensor.

55. The method of claim 54 wherein attaching the first and second driving members comprises coupling first and second piezoelectric driving members to the imaging die and the support member.

56. The method of claim 54 wherein the imaging die further comprises a first side having the image sensor and a second side opposite the first side, and wherein coupling the imaging die to the support member comprises attaching the imaging die to the support member with the first and/or second driving member positioned between the second side of the imaging die and the support member.

57. The method of claim 54 wherein the imaging die further comprises a first side having the image sensor, a second side opposite the first side, and a plurality of ends extending between the first and second sides, and wherein attaching the first and second driving members to the imaging die and the support member comprises coupling the first and/or second driving member between one of the ends of the imaging die and the support member.

58. The method of claim 54, further comprising attaching a flexible member between the imaging die and the support member.

59. A method for manufacturing a microelectronic imaging unit, the method comprising:

mounting an imaging die to a support substrate, the imaging die comprising an image sensor, an integrated circuit operably coupled to the image sensor, and a plurality of external contacts operably coupled to the integrated circuit, the image sensor including a plurality of pixels defining a focal plane;

coupling a plurality of piezoelectric driving members to the imaging die and the support substrate so that the piezoelectric driving members can selectively and independently move the imaging die in the focal plane relative to the support substrate;

attaching a plurality of electrodes to corresponding piezoelectric driving members and electrically connecting the electrodes to the integrated circuit;

electrically connecting the external contacts of the imaging die to corresponding terminals on the support substrate; and fastening a cover to the support substrate such that the cover is positioned over the image sensor.

60. The method of claim 59 wherein the imaging die further comprises a first side having the image sensor and a second side opposite the first side, and wherein mounting the imaging die to the support substrate comprises attaching the imaging die to the support substrate with at least one of the driving members positioned between the second side of the imaging die and the support substrate.

61. The method of claim 59 wherein the imaging die further comprises a first side having the image sensor, a second side opposite the first side, and a plurality of ends extending between the first and second sides, and wherein coupling the piezoelectric driving members to the imaging die and the support substrate comprises attaching at least one of the piezoelectric driving members to one of the ends of the imaging die and the support substrate.

62. The method of claim 59 wherein coupling the piezoelectric driving members to the imaging die and the support substrate comprises positioning a first driving member to selectively move the imaging die along a first axis in the focal plane and positioning a second driving member to selectively move the imaging die along a second axis in the focal plane, and wherein the first axis is transverse to the second axis.

63. The method of claim 59 wherein electrically connecting the external contacts to corresponding terminals comprises wire-bonding the external contacts to the corresponding terminals.

64. The method of claim 59, further comprising attaching a flexible member between the imaging die and the support substrate.

65. A method for manufacturing a plurality of microelectronic imaging units, the method comprising:

attaching a plurality of piezoelectric driving members to a support member; and coupling a plurality of singulated imaging dies to corresponding piezoelectric driving members so that the driving members are positioned between the imaging dies and the support member, the individual imaging dies comprising an image sensor, an integrated circuit operably coupled to the image sensor, and a plurality of external contacts operably coupled to the integrated circuit.

66. The method of claim 65, further comprising fastening a plurality of electrodes to corresponding piezoelectric driving members.

67. The method of claim 65, further comprising:

fastening a plurality of electrodes to corresponding piezoelectric driving members; and wire-bonding the electrodes to corresponding external contacts on the imaging die.

68. The method of claim 65 wherein attaching the driving members to the support member comprises coupling the driving members to a support substrate with a plurality of terminal arrays arranged relative to the driving members.

69. The method of claim 65 wherein attaching the driving members to the support member comprises coupling the driving members to a support substrate with a plurality of terminal arrays arranged relative to the driving members, and wherein the method further comprises wire-bonding the external contacts to corresponding terminals.

70. The method of claim 65, further comprising forming a barrier on the support member between adjacent imaging dies.

71. The method of claim 65, further comprising:

forming a barrier on the support member between adjacent imaging dies; and attaching a plurality of covers to the barrier with the individual covers over corresponding image sensors.

72. A method of operating an imaging unit in an electronic device, the method comprising:

providing an imaging unit including an imaging die attached to a support member, the imaging die comprising an image sensor, an integrated circuit operably coupled to the image sensor, and a plurality of external contacts operably coupled to the integrated circuit, the image sensor including a plurality of pixels defining a focal plane; and selectively moving the imaging die in the focal plane from a first position to a second position relative to the support member.

73. The method of claim 72, further comprising:

measuring a first intensity of light impinging upon the pixels at the first position; and measuring a second intensity of light impinging upon the pixels at the second position.

74. The method of claim 72 wherein selectively moving the imaging die comprises energizing a piezoelectric driving member positioned between the imaging die and the support member.

75. The method of claim 72 wherein selectively moving the imaging die comprises shifting the image sensor a distance approximately equal to a pixel pitch.

76. The method of claim 72 wherein selectively moving the imaging die comprises shifting the imaging die along a first axis in the focal plane, and wherein the method further comprises moving the imaging die along a second axis in the focal plane, the second axis being transverse to the first axis.

* * * * *

UNITED STATES PATENT AND TRADEMARK OFFICE
CERTIFICATE OF CORRECTION

| | |
|---|---|
| PATENT NO. | : 7,214,919 B2 |
| APPLICATION NO. | : 11/054692 |
| DATED | : May 8, 2007 |
| INVENTOR(S) | : Christian Boemler |

It is certified that error appears in the above-identified patent and that said Letters Patent is hereby corrected as shown below:

In the U.S. Patent Documents portion of the References Cited Section, the following 67 patents and 21 patent applications are added:
--

| | | |
|---|---|---|
| 3,345,134 | 10/1967 | Heymer et al. |
| 4,534,100 | 8/1985 | Lane |
| 4,906,314 | 3/1990 | Farnworth et al. |
| 5,130,783 | 7/1992 | McLellan |
| 5,371,397 | 12/1994 | Maegawa et al. |
| 5,424,573 | 6/1995 | Kato et al. |
| 5,435,887 | 7/1995 | Rothschild et al. |
| 5,505,804 | 4/1996 | Mizuguchi et al. |
| 5,560,047 | 5/2003 | Choi et al. |
| 5,593,913 | 1/1997 | Aoki |
| 5,605,783 | 2/1997 | Revelli et al. |
| 5,672,519 | 9/1997 | Song et al. |
| 5,694,246 | 12/1997 | Aoyama et al. |
| 5,708,293 | 1/1998 | Ochi et al. |
| 5,771,158 | 6/1998 | Yamagishi et al. |
| 5,776,824 | 7/1998 | Farnworth et al. |
| 5,811,799 | 9/1998 | Wu |
| 5,821,532 | 10/1998 | Beaman et al. |
| 5,857,963 | 1/1999 | Pelchy et al. |

UNITED STATES PATENT AND TRADEMARK OFFICE
CERTIFICATE OF CORRECTION

| | |
|---|---|
| PATENT NO. | : 7,214,919 B2 |
| APPLICATION NO. | : 11/054692 |
| DATED | : May 8, 2007 |
| INVENTOR(S) | : Christian Boemler |

It is certified that error appears in the above-identified patent and that said Letters Patent is hereby corrected as shown below:

In the U.S. Patent Documents portion of the References Cited Section... (cont'd),

| | | |
|---|---|---|
| 5,861,654 | 1/1999 | Johnson |
| 5,877,040 | 3/1999 | Park et al. |
| 5,897,338 | 4/1999 | Kaldenberg |
| 5,914,488 | 6/1999 | Sone |
| 5,977,535 | 11/1999 | Rostoker |
| 5,998,862 | 12/1999 | Yamanaka |
| 6,080,291 | 6/2000 | Woodruff et al. |
| 6,104,086 | 8/2000 | Ichikawa et al. |
| 6,114,240 | 9/2000 | Akram et al. |
| 6,143,588 | 11/2000 | Glenn |
| 6,236,046 | 5/2001 | Watabe et al. |
| 6,259,083 | 7/2001 | Kimura |
| 6,266,197 | 7/2001 | Glenn et al. |
| 6,274,927 | 8/2001 | Glenn |
| 6,285,064 | 9/2001 | Foster |
| 6,351,027 | 2/2002 | Giboney et al. |
| 6,372,548 | 2/2002 | Bessho et al. |
| 6,407,381 | 6/2002 | Glenn et al. |
| 6,411,439 | 6/2002 | Nishikawa |
| 6,483,652 | 11/2002 | Nakamura |

UNITED STATES PATENT AND TRADEMARK OFFICE
CERTIFICATE OF CORRECTION

| | |
|---|---|
| PATENT NO. | : 7,214,919 B2 |
| APPLICATION NO. | : 11/054692 |
| DATED | : May 8, 2007 |
| INVENTOR(S) | : Christian Boemler |

It is certified that error appears in the above-identified patent and that said Letters Patent is hereby corrected as shown below:

In the U.S. Patent Documents portion of the References Cited Section... (cont'd),

| | | |
|---|---|---|
| 6,503,780 | 1/2003 | Glenn et al. |
| 6,541,762 | 4/2003 | Knag et al. |
| 6,566,745 | 5/2003 | Beyne et al. |
| 6,603,183 | 8/2003 | Hoffman |
| 6,617,623 | 9/2003 | Rhodes |
| 6,661,047 | 12/2003 | Rhodes |
| 6,667,551 | 10/2001 | Hanaoka et al. |
| 6,670,986 | 12/2003 | Ben Shoshan et al. |
| 6,686,588 | 2/2004 | Webster et al. |
| 6,703,310 | 12/2002 | Mashino et al. |
| 6,734,419 | 5/2004 | Glenn et al. |
| 6,759,266 | 7/2004 | Hoffman |
| 6,774,486 | 8/2004 | Kinsman |
| 6,778,046 | 8/2003 | Stafford et al. |
| 6,791,076 | 9/2004 | Webster |
| 6,795,120 | 9/2004 | Takagi et al. |
| 6,797,616 | 9/2004 | Kinsman |
| 6,800,943 | 10/2004 | Adachi |
| 6,813,154 | 11/2004 | Diaz et al. |
| 6,825,458 | 11/2004 | Moess et al. |

UNITED STATES PATENT AND TRADEMARK OFFICE
CERTIFICATE OF CORRECTION

| | |
|---|---|
| PATENT NO. | : 7,214,919 B2 |
| APPLICATION NO. | : 11/054692 |
| DATED | : May 8, 2007 |
| INVENTOR(S) | : Christian Boemler |

It is certified that error appears in the above-identified patent and that said Letters Patent is hereby corrected as shown below:

In the U.S. Patent Documents portion of the References Cited Section... (cont'd),

| | | |
|---|---|---|
| 6,828,663 | 12/2004 | Chen et al.. |
| 6,828,674 | 12/2004 | Karpman |
| 6,844,978 | 1/2005 | Harden et al. |
| 6,864,172 | 4/2005 | Noma et al. |
| 6,882,021 | 4/2005 | Boon et al. |
| 6,885,107 | 4/2005 | Kinsman |
| 6,934,065 | 8/2005 | Kinsman |
| 6,946,325 | 9/2005 | Yean et al. |
| 2002/0006687 | 1/2002 | Lam |
| 2002/0057468 | 5/2002 | Segawa |
| 2002/0089025 | 7/2002 | Chou |
| 2002/0096729 | 7/2002 | Tu et al. |
| 2002/0113296 | 8/2002 | Cho et al. |
| 2002/0145676 | 10/2002 | Kuno et al. |
| 2003/0062601 | 4/2003 | Hamden et al. |
| 2004/0012698 | 1/2004 | Suda et al. |
| 2004/0023469 | 2/2004 | Suda |
| 2004/0038442 | 2/2004 | Kinsman |
| 2004/0041261 | 3/2004 | Kinsman |
| 2004/0082094 | 4/2004 | Yamamoto |

UNITED STATES PATENT AND TRADEMARK OFFICE
CERTIFICATE OF CORRECTION

| | |
|---|---|
| PATENT NO. | : 7,214,919 B2 |
| APPLICATION NO. | : 11/054692 |
| DATED | : May 8, 2007 |
| INVENTOR(S) | : Christian Boemler |

It is certified that error appears in the above-identified patent and that said Letters Patent is hereby corrected as shown below:

In the U.S. Patent Documents portion of the References Cited Section... (cont'd),

| | | |
|---|---|---|
| 2004/0214373 | 10/2004 | Jiang et al. |
| 2004/0245649 | 12/2004 | Imaoka |
| 2005/0052751 | 6/2005 | Liu et al. |
| 2005/0104228 | 5/2005 | Rigg et al. |
| 2005/0110889 | 5/2005 | Tuttle et al. |
| 2005/0127478 | 6/2005 | Hiatt et al. |
| 2005/0151228 | 7/2005 | Tanida et al. |
| 2005/0236708 | 10/2005 | Farnworth et al. |
| 2005/0254133 | 11/2005 | Akram et al. |

--
In the Foreign Patent Documents portion of the References Cited section, the following 11 foreign patent documents are added:
--

| | | |
|---|---|---|
| WO | 02/075815-A1 | 9/2002 |
| WO | 02/095796-A2 | 11/2002 |
| FR | 2 835 654-A1 | 8/2003 |
| WO | 2004/054001-A2 | 6/2004 |
| JP | 59-101882-A | 6/1984 |
| JP | 59-191388 | 10/1984 |
| WO | 90/05424-A1 | 5/1990 |
| JP | 07-263607-A | 10/1995 |
| EP | 0 886 323 | 12/1998 |

UNITED STATES PATENT AND TRADEMARK OFFICE
CERTIFICATE OF CORRECTION

| | |
|---|---|
| PATENT NO. | : 7,214,919 B2 |
| APPLICATION NO. | : 11/054692 |
| DATED | : May 8, 2007 |
| INVENTOR(S) | : Christian Boemler |

It is certified that error appears in the above-identified patent and that said Letters Patent is hereby corrected as shown below:

In the Foreign Patent Documents portion of the References Cited section… (cont'd),

JP    2001-077496-A    3/2001

EP    1 157 967-A2    11/2001

--

The following 37 patent applications are added:

| | |
|---|---|
| US-10/785,466 | Kirby |
| US-10/845,304 | Jiang et al. |
| US-10/857,948 | Boettiger at al. |
| US-10/863,994 | Akram et al. |
| US-10/864,974 | Kirby et al. |
| US-10/867,352 | Farnworth et al. |
| US-10/867,505 | Farnworth et al. |
| US-10/879,398 | Akram et al. |
| US-10/879,838 | Kirby et al. |
| US-10/893,022 | Hall et al. |
| US-10/894,262 | Farnworth et al. |
| US-10/901,851 | Derderian et al. |
| US-10/910,491 | Bolken et al. |
| US-10/915,180 | Street et al. |
| US-10/919,604 | Farnworth et al. |
| US-10/922,177 | Oliver et al. |

UNITED STATES PATENT AND TRADEMARK OFFICE
CERTIFICATE OF CORRECTION

| | |
|---|---|
| PATENT NO. | : 7,214,919 B2 |
| APPLICATION NO. | : 11/054692 |
| DATED | : May 8, 2007 |
| INVENTOR(S) | : Christian Boemler |

It is certified that error appears in the above-identified patent and that said Letters Patent is hereby corrected as shown below:

The following 37 patent applications are added (cont'd):

| | |
|---|---|
| US-10/922,192 | Farnworth |
| US-10/925,406 | Oliver |
| US-10/925,501 | Oliver |
| US-10/925,502 | Watkins et al. |
| US-10/927,550 | Derderian et al. |
| US-10/927,760 | Chong et al. |
| US-10/928,598 | Kirby |
| US-10/932,296 | Oliver et al. |
| US-11/027,443 | Kirby |
| US-11/056,211 | Hembree et al. |
| US-11/056,484 | Boettiger et al. |
| US-11/061,034 | Boettiger |
| US-11/146,783 | Tuttle et al. |
| US-11/169,546 | Sulfridge |
| US-11/169,838 | Sulfridge |
| US-11/177,905 | Akram |
| US-11/209,524 | Akram |
| US-11/217,169 | Hiatt et al. |
| US-11/217,877 | Oliver et al. |

UNITED STATES PATENT AND TRADEMARK OFFICE
CERTIFICATE OF CORRECTION

| | | |
|---|---|---|
| PATENT NO. | : 7,214,919 B2 | |
| APPLICATION NO. | : 11/054692 | |
| DATED | : May 8, 2007 | |
| INVENTOR(S) | : Christian Boemler | |

It is certified that error appears in the above-identified patent and that said Letters Patent is hereby corrected as shown below:

US-11/218,126        Farnworth et al.

US-11/218,243        Kirby et al.
--
      In the Other Publications portion of the References Cited section the following 34 publications are added:

-- AACHBOUN, S. and P. Ranson, "Cryogenic etching of deep narrow trenches in silicon," J. Vac. Sci. Technol. A 18(4), July/Aug 2000, pp. 1848-1852.

AACHBOUN, S. and P. Ranson, "Deep anisotropic etching of silicon," J. Vac. Sci. Technol. A 17(4), Jul/Aug 1999, pp. 2270-2273.

AUSTIN, M.D. and S.Y. Chou, "Fabrication of 70 nm channel length polymer organic thin-film transistors using nanoimprint lithography," Applied Physics Letters, Vol. 81, No. 23, pp. 4431-4433, Dec. 2, 2002, American Institute of Physics.

BLACKBURN, J.M. et al., "Deposition of Conformal Copper and Nickel Films from Supercritical Carbon Dioxide," Science, Vol. 294, pp. 141-145, Oct. 5, 2001.

BRUBAKER, C. et al., "Ultra-thick Lithography for Advanced Packaging and MEMS," SPIE's 27th Annual International Symposium on Microlithography 2002, Mar. 3-8, 2002, Santa Clara, CA.

CHENG, Yu-T. et al., "Vacuum Packaging Technology Using Localized Aluminum/ Silicon-to-Glass Bonding," Journal of Microelectromechanical Systems, Vol. 11, No. 5, pp. 556-565, Oct. 2002.

DUPONT Electronic Materials, Data Sheet, Pyralux PC 2000 Flexible Composites, 4 pgs., Oct. 1998, <http://www.dupont.com/fcm>.

EDMUND Industrial Optics, Mounted IR Filters, 1 pg., retrieved from the Internet on Jun. 30, 2003, <http://www.edmundoptics.com>.

HAMDORF, M. et al., "Surface-rheological measurements on glass forming polymers based on the surface tension driven decay of imprinted corrugation gratings," Journal of Chemical Physics, 112(9), pp. 4262-4270, Mar. 1, 2000, American Institute of Physics.

HIRAFUNE, S. et al., "Packaging Technology for Imager Using Through-hole Interconnection in Si Substrate," Proceeding of HDP'04, IEEE, pp. 303-306, Jul. 2004.

UNITED STATES PATENT AND TRADEMARK OFFICE
CERTIFICATE OF CORRECTION

| | | |
|---|---|---|
| PATENT NO. | : 7,214,919 B2 | |
| APPLICATION NO. | : 11/054692 | |
| DATED | : May 8, 2007 | |
| INVENTOR(S) | : Christian Boemler | |

It is certified that error appears in the above-identified patent and that said Letters Patent is hereby corrected as shown below:

In the Other Publications portion of the References Cited section…(cont'd),

IBM, Zurich Research Laboratory, EPON SU-8 photoresist, 1 pg., retrieved from the Internet on Jan. 21, 2003, <http://www.zurich.ibm.com/st/mems/su8.html>.

INTRINSIC Viscosity and its Relation to Intrinsic Conductivity, 9 pgs., retrieved from the Internet on Oct. 30, 2003, <http://www.ciks.cbt.nist.gov/garbocz/paper58/node3.html>.

KING, B. et al., Optomec, Inc., M3D™ Technology, Maskless Mesoscale™ Materials Deposition, 5 pgs., retrieved from the Internet on Jun. 17, 2005, <http://www.optomec.com/downloads/M3D%20White%Paper%20080502.pdf>.

KINGPAK Technology, Inc. "CMOS Image Sensor Packaging," 1 pg., retrieved from the Internet on Aug. 26, 2003, <http://www.kingpak.com/CMOSImager.html>.

KRAMER, S.J. et al., "Annual Report—Applications of Supercritical Fluid Technology to Semiconductor Device Processing," pp. 1-29, Nov 2001.

KYOCERA Corporation, Memory Package, 1 pg., retrieved from the Internet on Dec. 3, 2004, <http://global.kyocera.com/prdct/semicon/ic_pkg/memory_p, html>.

LIN, Tim (Zhigang) and Rick Yoon, "One Package Technique of Exposed MEMS Sensors," pp. 105-108, 2002 International Symposium on Microelectronics, Sep. 2002.

MA, X. et al., "Low Temperature Bonding for Wafer Scale Packaging and Assembly of Micromachined Sensors," Final Report 1998-1999 for MICRO Project 98-144, 3 pgs., Dept. of Electrical & Computer Engineering, Univ. of California, Davis.

MICRO CHEM, Nano™ SU-8, Negative Tone Photoresist Formulations 50-100, 4 pgs., Feb. 2002, <http://www.microchem.com/products/pdf/SU8_50-100.pdf>.

OPTOMEC, Inc., M3D™ Technology, Maskless Mesoscale Materials Deposition (M3D), 1 pg., retrieved from the Internet on Aug. 15, 2003, <http://www.optomec.com/html/m3d.htm>.

OPTOMEC, Inc., M3D™, Maskless Mesoscale™ Materials Deposition, 2 pgs., retrieved from the Internet on June 17, 2005, <http://www.optomec.com/downloads/M3DSheet.pdf>.

PHOTO Vision Systems, Inc., "Advances in Digital Image Sensors," 22 pgs., First Annual New York State Conference on Microelectronic Design, Jan. 12, 2002.

UNITED STATES PATENT AND TRADEMARK OFFICE
CERTIFICATE OF CORRECTION

| | | |
|---|---|---|
| PATENT NO. | : 7,214,919 B2 | |
| APPLICATION NO. | : 11/054692 | |
| DATED | : May 8, 2007 | |
| INVENTOR(S) | : Christian Boemler | |

It is certified that error appears in the above-identified patent and that said Letters Patent is hereby corrected as shown below:

In the Other Publications portion of the References Cited section… (cont'd),

SHEN, X.-J. et al., "Microplastic embossing process: experimental and theoretical characterizations," Sensors and Actuators, A 97-98 (2002), pp. 428-433, Elsevier Science B.V.

TAPES II International Tape and Fabrication Company, Electronics and Electrical Tapes, 2 pgs., 2003, <http://www.tapes2.com/electronics.htm>.

TRANSCHIP, 1 pg., retrieved from the Internet on Aug. 26, 2003, <http://www.missionventures.com/portfolio/companies/transchip.html>.

TRANSCHIP, Inc., CMOS vs CCD, 3 pgs., retrieved from the Internet on Dec. 14, 2005, <http://www.transchip.com/content.aspx?id=127>.

TRANSCHIP, Inc., Technology, 3 pgs., retrieved from the Internet on Dec. 14, 2005, <http://wwwtranschip.com/content.aspx?id=10>.

UCI Integrated Nanosystems Research Facility, "Cleaning procedures for glass substrates," 3 pgs., Fall 1999.

UCI Integrated Nanosystems Research Facility, "Glass Etch Wet Process," 3 pgs., Summer 2000.

WALKER, M.J., "Comparison of Bosch and cryogenic processes for patterning high aspect ratio features in silicon," 11 pgs., Proc. SPIE vol. 4407. p. 89-99, MEMS Design, Fabrication, Characterization, and Packaging, Uwe F. Behringer; Deepak G. Uttamchandani; Eds., Apr. 2001.

XSIL, Via Applications, 1 pg., retrieved from the Interneton Jul. 22, 2003, <http://www.xsil.com/viaapplications/index.htm>.

XSIL, Vias for 3D Packaging, 1 pg., retrieved from the Internet on Jul. 22, 2003, <http://www.xsil.com/viaapplications/3dpackaging/index.htm>.

YE, X.R. et al., "Immersion Deposition of Metal Films on Silicon and Germanium Substrates in Supercritical Carbon Dioxide," Chem. Mater. 2003, 15, 83-91.

YOSHIDA, J., "TransChip rolls out a single-chip CMOS imager," 3 pgs., EE Times, Jul 18, 2003. --

UNITED STATES PATENT AND TRADEMARK OFFICE
CERTIFICATE OF CORRECTION

| | | |
|---|---|---|
| PATENT NO. | : 7,214,919 B2 | Page 11 of 11 |
| APPLICATION NO. | : 11/054692 | |
| DATED | : May 8, 2007 | |
| INVENTOR(S) | : Christian Boemler | |

It is certified that error appears in the above-identified patent and that said Letters Patent is hereby corrected as shown below:

In the Specification, the following error is corrected:

Column 1, line 26, "-very" should read --very--.

Signed and Sealed this

Thirty-first Day of July, 2007

JON W. DUDAS
*Director of the United States Patent and Trademark Office*